United States Patent
Lin et al.

(10) Patent No.: US 11,557,360 B1
(45) Date of Patent: Jan. 17, 2023

(54) MEMORY TEST CIRCUIT AND DEVICE WAFER

(71) Applicant: NANYA TECHNOLOGY CORPORATION, New Taipei (TW)

(72) Inventors: Yan-De Lin, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/467,878

(22) Filed: Sep. 7, 2021

(51) Int. Cl.
| | |
|---|---|
| G11C 29/00 | (2006.01) |
| G11C 29/50 | (2006.01) |
| G11C 29/02 | (2006.01) |
| G11C 11/4078 | (2006.01) |

(52) U.S. Cl.
CPC ........ G11C 29/006 (2013.01); G11C 11/4078 (2013.01); G11C 29/025 (2013.01); G11C 29/50004 (2013.01); G11C 29/787 (2013.01); G11C 2029/5004 (2013.01); G11C 2229/763 (2013.01)

(58) Field of Classification Search
CPC . G11C 29/006; G11C 11/4078; G11C 29/025; G11C 29/50004; G11C 29/787; G11C 2029/5004; G11C 2229/763
See application file for complete search history.

(56) References Cited

U.S. PATENT DOCUMENTS

| | | | | |
|---|---|---|---|---|
| 4,800,332 A | | 1/1989 | Hutchins | |
| 5,519,657 A | * | 5/1996 | Arimoto | G11C 29/80 365/201 |
| 6,434,065 B1 | * | 8/2002 | Kobayashi | G11C 7/12 365/189.11 |
| 6,731,561 B2 | * | 5/2004 | Abe | G11C 29/46 365/201 |
| 6,940,767 B2 | * | 9/2005 | Ooishi | G11C 29/02 365/201 |
| 7,348,596 B2 | | 3/2008 | Lin | |
| 8,724,418 B2 | | 5/2014 | Kim et al. | |
| 2015/0049546 A1 | | 2/2015 | Choi | |

FOREIGN PATENT DOCUMENTS

TW 1701676 B 8/2020

* cited by examiner

Primary Examiner — Vanthu T Nguyen
(74) Attorney, Agent, or Firm — Muncy, Geissler, Olds & Lowe, P.C.

(57) ABSTRACT

The present application provides a memory test circuit and a device wafer including the memory test circuit. The memory test circuit is coupled to a memory array having intersecting first and second signal lines, and includes a fuse element and a transistor. The fuse element has a first terminal coupled to a first group of the first signal lines and a test voltage, and has a second terminal coupled to second and third groups of the first signal lines. The transistor has a source/drain terminal coupled to the second terminal of the fuse element and another source/drain terminal coupled to a reference voltage. The first group of the first signal lines are selectively coupled to the test voltage when the transistor is turned on, and all of the first signal lines are coupled to the test voltage when the transistor is kept off.

20 Claims, 13 Drawing Sheets

MEMORY TEST CIRCUIT AND DEVICE WAFER

TECHNICAL FIELD

The present disclosure relates to a testing circuit and a testing method for a memory device, and more particularly, to a testing circuit and testing method for a dynamic random access memory (DRAM) device.

DISCUSSION OF THE BACKGROUND

In recent decades, demand to storage capability has increased as electronic products continue to improve. In order to increase storage capability of a memory device (e.g., a DRAM device), more memory cells are integrated in the memory device. As the integration level increases, fabrication process of the memory device become much more complicated, and process window become rather narrow. As a consequence, increase of integration level may result in higher possibility of leakage among the memory cells.

In addition to develop a more advanced fabrication process, a testing procedure performed on the fabricated memory device is required for ensuring low leakage or leakage-free of memory product. However, current testing procedure is destructive to the memory device, and fails to provide localized inspection. Therefore, result of the testing procedure could only provide limited information of the memory device.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a memory test circuit is provided. The memory circuit is coupled to a memory array having intersecting first and second signal lines, and comprises: a first fuse element with a first terminal coupled to a first group of the first signal lines and a second terminal coupled to second and third groups of the first signal lines, wherein the first terminal is coupled to a first test voltage; and a first transistor, with a first source/drain terminal coupled to the second terminal of the first fuse element and a second source/drain terminal coupled to a reference voltage, wherein the first fuse element is configured to be blown open when the first transistor is turned on for coupling the second terminal of the first fuse element to the reference voltage, and the first fuse element acts as a resistor when the first transistor is kept off for decoupling the second terminal of the first fuse element from the reference voltage.

In another aspect of the present disclosure, a memory test circuit is provided. The memory circuit is coupled to a memory array having intersecting first and second signal lines, and comprises: a first anti-fuse element with a first terminal coupled to a first group of the first signal lines and a second terminal coupled to second and third groups of the first signal lines, wherein the first terminal is coupled to a first test voltage; and a first transistor, with a first source/ drain terminal coupled to the second terminal of the first anti-fuse element and a second source/drain terminal coupled to a reference voltage, wherein the first anti-fuse element acts as a short circuit when the first transistor is turned on for coupling the second terminal of the first anti-fuse element to the reference voltage, and the first fuse element acts as an open circuit when the first transistor is kept off for decoupling the second terminal of the first anti-first fuse element from the reference voltage.

In yet another aspect of the present disclosure, a device wafer is provided. The device wafer has die regions and a scribe line region extending between the die regions, and comprises: memory arrays, disposed in the die regions; a duplicate memory array, disposed in the scribe line region, and substantially identical with one of the memory arrays in the die regions; and a test circuit, disposed in the scribe line region and coupled to the duplicate memory array. The test circuit comprises: a first one-time programmable device with a first terminal coupled to a first group of first signal lines of the duplicate memory array and a second terminal coupled to second and third groups of the first signal lines, wherein the first terminal is coupled to a first test voltage; and a first transistor, with a first source/drain terminal coupled to the second terminal of the first one-time programmable device and a second source/drain terminal coupled to a reference voltage.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
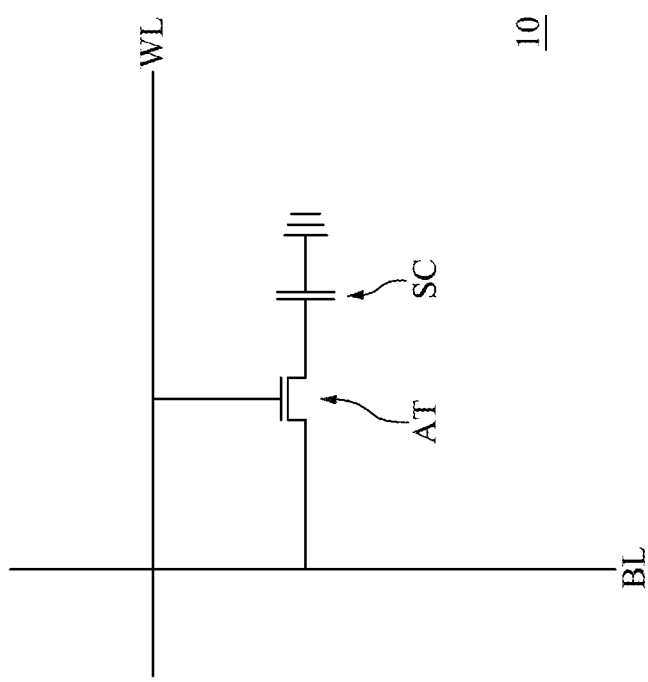
FIG. 1A is a circuit diagram illustrating a memory cell in a memory array, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a circuit diagram illustrating a memory cell 10 in a memory array, according to some embodiments of the present disclosure.

Referring to FIG. 1A, in some embodiments, the memory array is a DRAM array. In these embodiments, each memory cell 10 in the memory array may include a transistor AT and a storage capacitor SC. A terminal of the storage capacitor SC is coupled to a source/drain terminal of the transistor AT, while the other terminal of the storage capacitor SC may be coupled to a reference voltage (e.g., a ground voltage). The transistor AT is functioned as an access transistor of the memory cell 10, while the storage capacitor SC is configured to store charge.

During a write operation, the transistor AT is turned on by asserting a word line WL coupled to a gate terminal of the transistor AT, and a voltage applied on a bit line BL coupled to a source/drain terminal of the transistor AT may be transferred to the storage capacitor SC coupled to the other source/drain terminal of the transistor AT. Accordingly, the storage capacitor SC may be charged or discharged, and a logic state "1" or a logic state "0" can be stored in the storage capacitor SC. During a read operation, the transistor AT is turned on as well, and the charge stored in the storage capacitor SC may pull up or pull down the pre-charged bit line BL. By comparing a voltage on the bit line BL with a reference voltage, the charge stored in the storage capacitor SC can be sensed, and the logic state of the memory cell 10 can be determined.

Figure 1B:
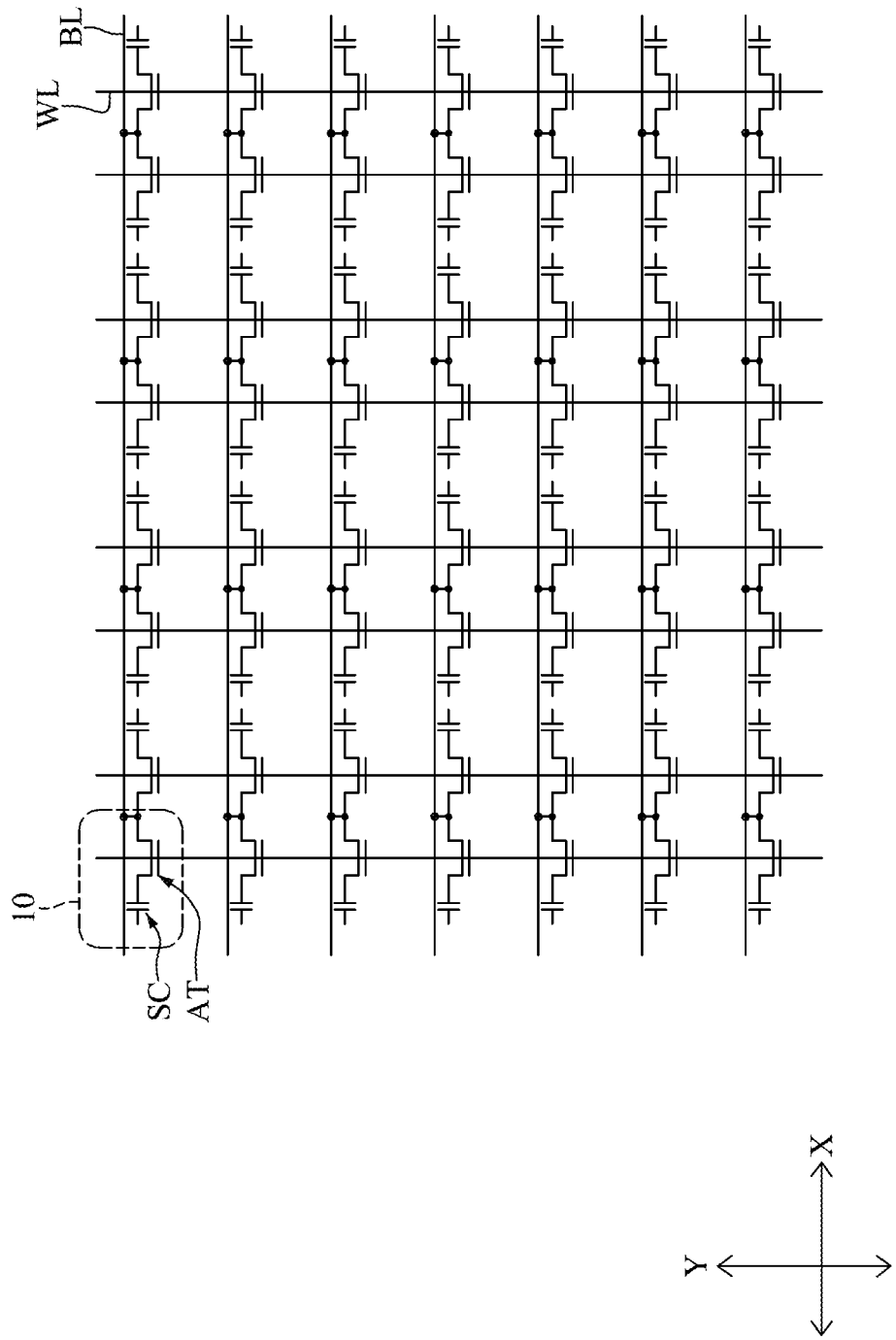
FIG. 1B is a memory array including a plurality of the memory cells as shown in FIG. 1A, according to some embodiments of the present disclosure.

FIG. 1B is a memory array 100 including a plurality of the memory cells 10, according to some embodiments of the present disclosure.

Referring to FIG. 1B, the memory array 100 has rows and columns. The memory cells 10 in each row are arranged along a direction X, while the memory cells 10 in each column are arranged along a direction Y intersected with the direction X. In some embodiments, the memory cells 10 in each row are connected in pairs. The transistors AT in the memory cells 10 of each pair are connected with each other by a common source/drain terminal, and this common source/drain terminal is coupled to a bit line BL. In addition, other source/drain terminals of the transistors AT in these memory cells 10 of each pair are respectively coupled to a storage capacitor SC, and gate terminals of the transistors AT in these memory cells 10 of each pair are respectively coupled to a word line WL. Further, each bit line BL may be shared by the memory cells 10 in a row, and extends along the direction X. On the other hand, each word line WL may be shared by the memory cells 10 arranged in a column, and extends along the direction Y.

Figure 2A:
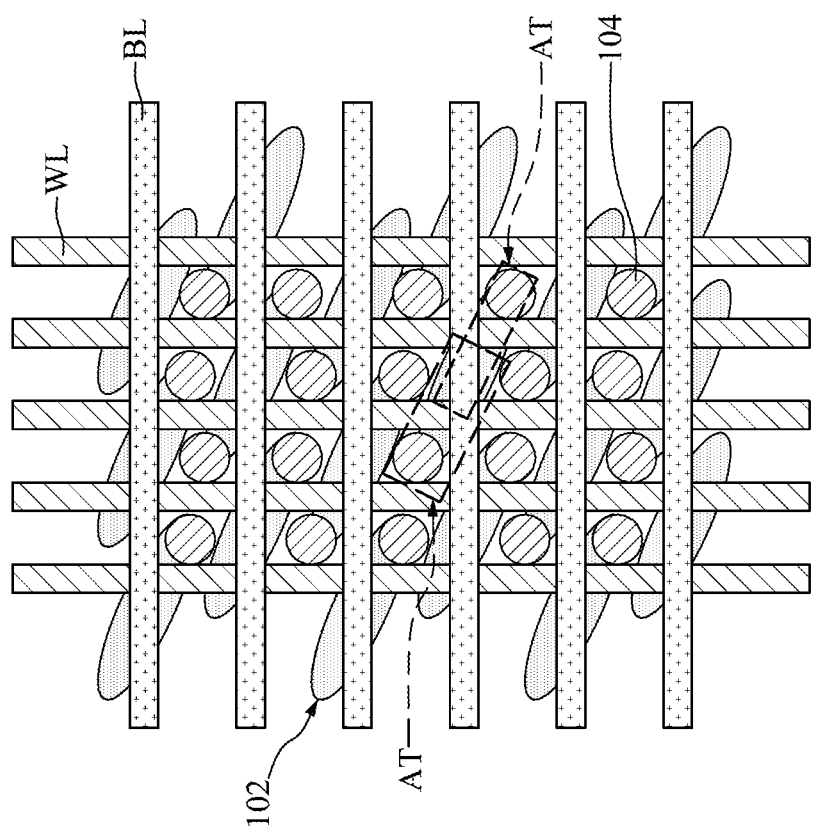
FIG. 2A is a layout diagram illustrating a portion of the memory array as shown in FIG. 1B, according to some embodiments of the present disclosure.

FIG. 2A is a layout diagram illustrating a portion of the memory array 100 as described with reference to FIG. 1B, according to some embodiments of the present disclosure.

Referring to FIG. 2A, the transistors AT of the memory cells 10 are formed on active areas 102. The active areas 102 may be well regions in a semiconductor substrate, such as a semiconductor wafer or a semiconductor-on-insulator (SOI) wafer. In addition, the active areas 102 may be laterally surrounded by an isolation structure (not shown) extending into the semiconductor substrate from a front surface of the semiconductor substrate, thus can be isolated from one another. In some embodiments, a major axis of each active area 102 extends along a direction D intersected with the direction X and the direction Y. Further, the active areas 102 may respectively be formed in an ellipse shape. However, those skilled in the art may modify geometry of the active areas 102 according to design requirements, the present disclosure is not limited thereto.

The word lines WL are each intersected with a column of the active areas 102 arranged along the direction Y. In addition, the word lines WL are capacitively coupled to the active areas 102, and each connect the gate terminals of a column of the transistors AT. Portions of an active area 102 at opposite sides of an intersecting word line WL are functioned as source/drain terminals of the transistor AT formed at the intersection of the active area 102 and the word line WL. In some embodiments, the word lines WL are buried in the semiconductor substrate, and may laterally penetrate through the active areas 102. Further, in those embodiments where the memory cells 10 in each row are connected in pairs, each active area 102 may be intersected with two of the word lines WL, and a pair of the transistors AT are formed at intersections of each active area 102 and two intersecting word lines WL. In these embodiments, a portion of each active area 102 between the two intersecting word lines WL may be functioned as a common source/drain terminal of the corresponding pair of the transistors AT.

The bit lines BL run over the active areas 102, and are each intersected with a row of the active areas 102 arranged along the direction X. A portion of each active area 102 as one of the source/drain terminals of a transistor AT is coupled to the intersecting bit line BL. In those embodiments where a pair of the transistors AT are formed at intersections of each active area 102 and two intersecting word lines WL, a portion of each active area 102 between the two intersecting word lines WL is functioned as a common source/drain terminal of the pair of the transistors AT, and coupled to the intersecting bit line BL. Although not shown, the active areas 102 may be coupled to the overlying bit lines BL through bit line contacts. The bit line contacts are located at intersections of the active areas 102 and the bit lines BL, and vertically extend between the active areas 102 and the bit lines BL.

The storage capacitors SC, which are not shown in FIG. 2A, lie over the active areas 102, and are coupled to the active areas 102 through capacitor contacts 104. Portions of each active area 102 as source/drain terminals of a transistor AT are coupled to one of the bit lines BL and one of the storage capacitors SC, respectively. In this way, one of the capacitor contacts 104 and one of the bit line contacts (not shown) coupled to each active area 102 are located at opposite sides of an intersecting word line WL. In those embodiments where a pair of the transistors AT are formed at intersections of each active area 102 and two intersecting word lines WL, the portion of each active area 102 between the two intersecting word lines WL is coupled to one of the bit line contacts, and portions of each active area 102 at opposite sides of the two intersecting word lines WL are coupled to two of the capacitor contacts 104. The capacitor contacts 104 may vertically extend between the active areas 102 and the storage capacitors SC (not shown in FIG. 2A), and may be formed in circular shapes. However, those skilled in the art may modify geometry of the capacitor contacts 104 according to design requirements, the present disclosure is not limited thereto.

The capacitor contacts 104 should be isolated from the bit lines BL. However, in certain cases, leakage path may be formed between some of the capacitor contacts 104 and their neighboring bit lines BL, as a result of lithography overlay issue, etching damages, defects or other issues during manufacturing of the memory array 100.

Figure 2B:
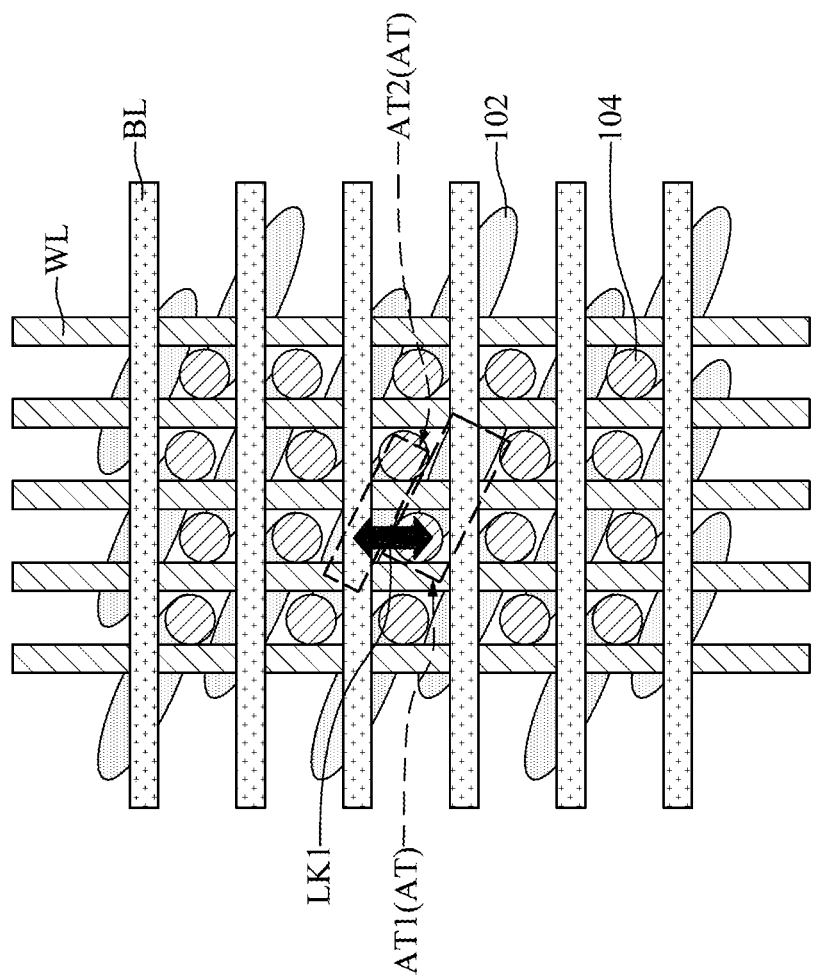
FIG. 2B illustrates a leakage path between a capacitor contact and an adjacent bit line in the memory array as shown in FIG. 2A.

FIG. 2B illustrates a leakage path LK1 between a capacitor contact 104 and an adjacent bit line BL in the memory array 100 as shown in FIG. 2A.

Referring to FIG. 2B, the capacitor contact 104 of a transistor AT (referred as a transistor AT1) may be undesirably shorted to a bit line BL coupled with a neighboring transistor AT (referred as a transistor AT2), as indicated by the leakage path LK1. As a result of such leakage, the capacitor contact 104 of the transistor AT1 may charge or discharge the bit line BL coupled to the transistor AT2. Accordingly, the charge stored in the storage capacitor SC (not shown in FIG. 2B) coupled to the capacitor contact 104 of the transistor AT2 may be accidentally altered by the voltage on the bit line BL coupled to the transistor AT2, if the word line WL coupled to the transistor AT2 is asserted. In addition, since the voltage on the bit line BL coupled to the transistor AT2 is pulled up or pulled down, other storage capacitors SC (not shown in FIG. 2B) coupled to this bit line BL may be affected. Alternatively, the bit line BL coupled to the transistor AT2 may charge or discharge the storage capacitor SC (not shown in FIG. 2B) coupled to the capacitor contact 104 of the transistor AT1. As a result, charge stored in the storage capacitor SC coupled to the capacitor contact 104 of the transistor AT1 may be altered, even when the word line WL coupled to the transistor AT1 is not asserted.

Furthermore, adjacent ones of the capacitor contacts 104 should be isolated from one another. However, in certain cases, leakage path may be formed between adjacent capacitor contacts 104, as a result of lithography overlay issue, defects, etching damages or other issues during manufacturing of the memory array 100. Particularly, adjacent ones of the capacitor contacts 104 at opposite sides of a word line WL are susceptible to such shorting issue.

Figure 2C:
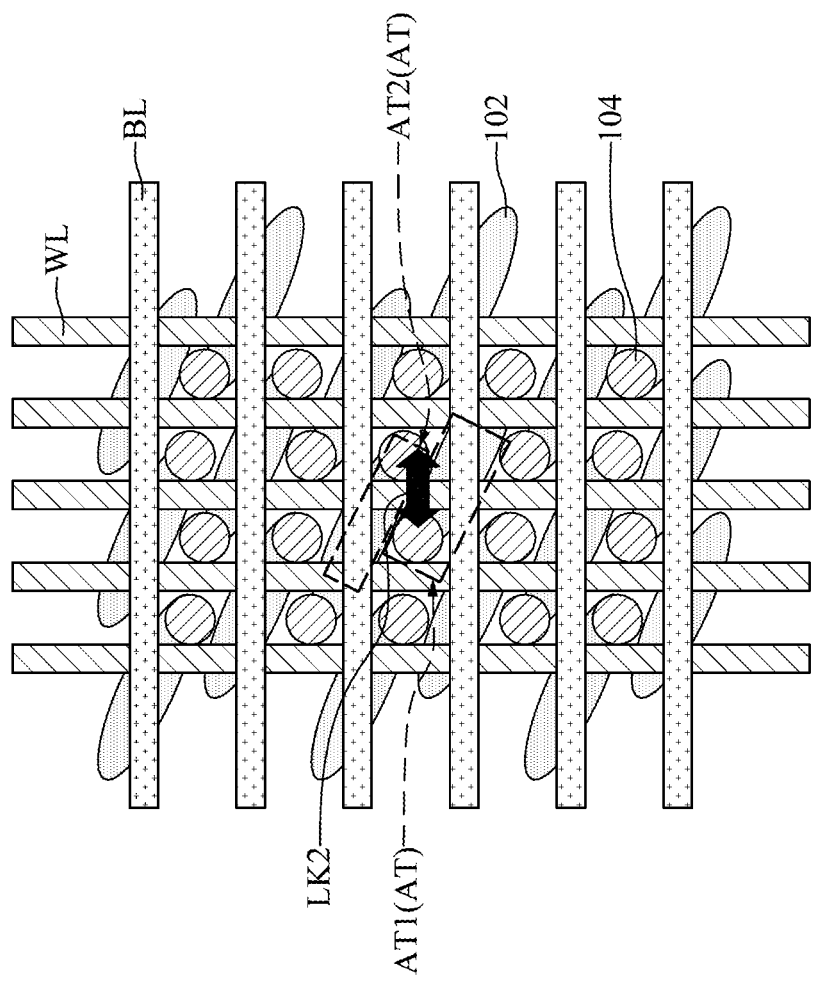
FIG. 2C illustrates a leakage path between adjacent capacitor contacts in the memory array as shown in FIG. 2A.

FIG. 2C illustrates a leakage path LK2 between adjacent capacitor contacts 104 in the memory array 100 as shown in FIG. 2A.

Referring to FIG. 2C, the capacitor contact 104 of the transistor AT1 may be undesirably shorted with the capacitor contact 104 of the transistor AT2, as indicated by the leakage path LK2. Normally, the storage capacitor SC (not shown in FIG. 2C) coupled to the capacitor contact 104 of the transistor AT1 and the storage capacitor SC coupled to the capacitor contact 104 of the transistor AT2 should be accessed by different ones of the bit lines BL. As a result of the leakage path LK2, one of these storage capacitors SC could be charged or discharged without controlling the corresponding bit line BL. For instance, when the transistor AT2 is kept off, the storage capacitor SC coupled to the capacitor contact 104 of the transistor AT2 could still be charged by the storage capacitor SC coupled to the capacitor contact 104 of the transistor AT1 through the leakage path LK2, if the storage capacitor SC of the transistor AT1 is/was charged by the corresponding bit line BL.

In addition to the leakage paths LK1, LK2 described with reference to FIG. 2B and FIG. 2C, there might be more leakage paths in the memory array 100. In order to address these shorting issues, the memory arrays 10 have to be inspected during or after the manufacturing process.

Figure 3A:
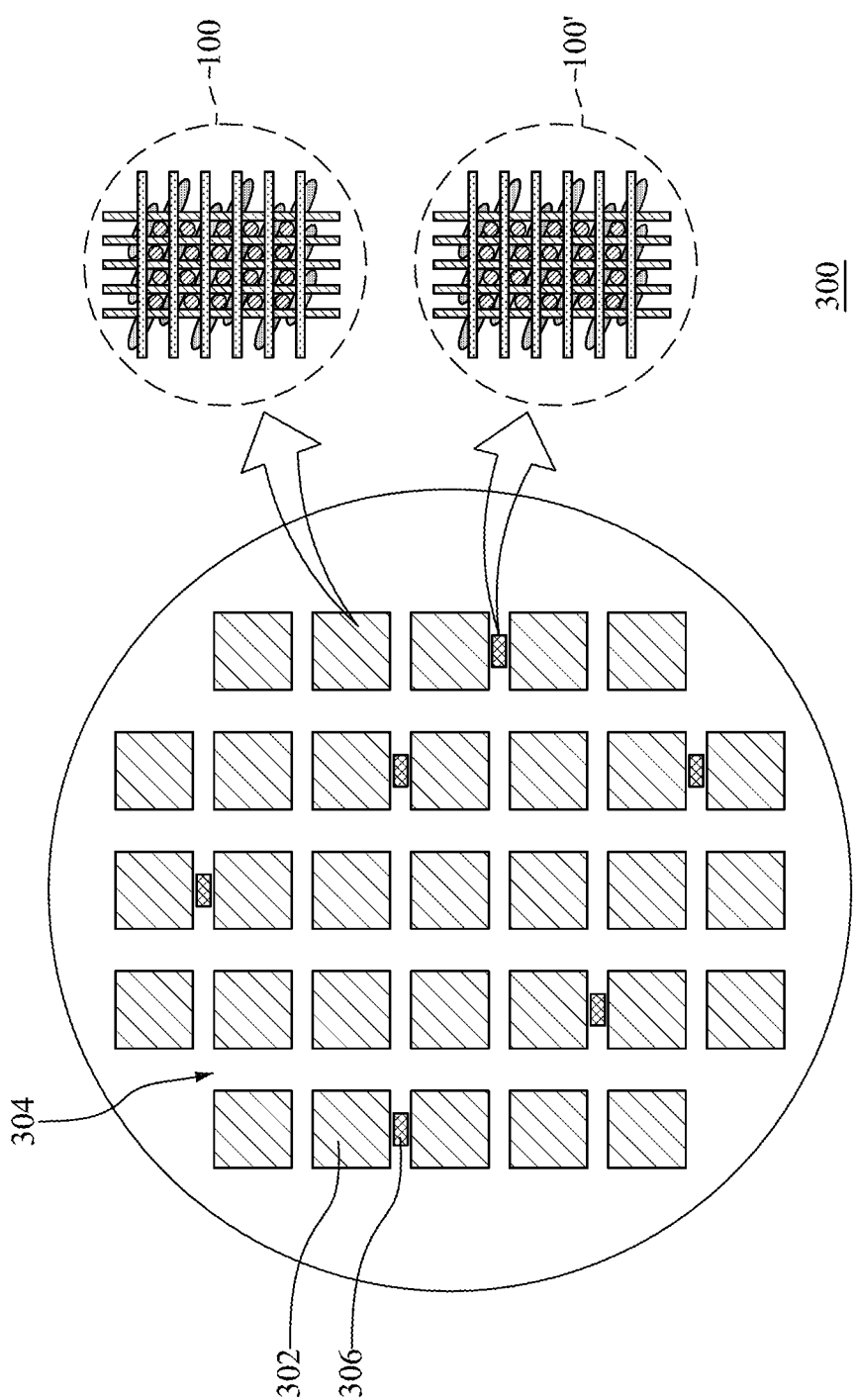
FIG. 3A is a schematic plan view illustrating a device wafer, according to some embodiments of the present disclosure.

FIG. 3A is a schematic plan view illustrating a device wafer 300, according to some embodiments of the present disclosure.

Referring to FIG. 3A, a device wafer 300 may include a plurality of die regions 302 arranged along rows and columns. Each of the die regions 302 may include a plurality of the memory arrays 100 as described with reference to FIG. 1B and FIG. 2A. Although not shown, each die region 302 may further include a driving circuit for operating the memory arrays 100. In some embodiments, a seal ring (not shown) extends along an inner boundary of each die region 302.

The die regions 302 are laterally separated from one another by a scribe line region 304. During a singulation process, the device wafer 300 may be cut through the scribe line region 304, and the die regions 302 are singulated to form semiconductor dies. In those embodiments the seal rings are formed in the die regions 302, the seal rings may protect the enclosed memory arrays 100 and the driving circuit from possible damages during the singulation process.

Test structures 306 are deployed in the scribe line region 304. During or after manufacturing of the memory arrays 100, test procedures may be performed on the test structures 306. Each test structure 306 may include at least one duplicate memory array 100'. The duplicate memory arrays 100' in the test structures 306 may be substantially identical with the memory arrays 100 formed in the die regions 302. Therefore, evaluation of the memory arrays 100 in the dire regions 302 can be realized by testing the duplicate memory arrays 100' in the test structures 306. In some embodiments, the test structures 306 are separately deployed in the scribe line region 304. Those skilled in the art may adjust an amount or positions of the test structures 306, the present disclosure in not limited thereto.

Figure 3B:
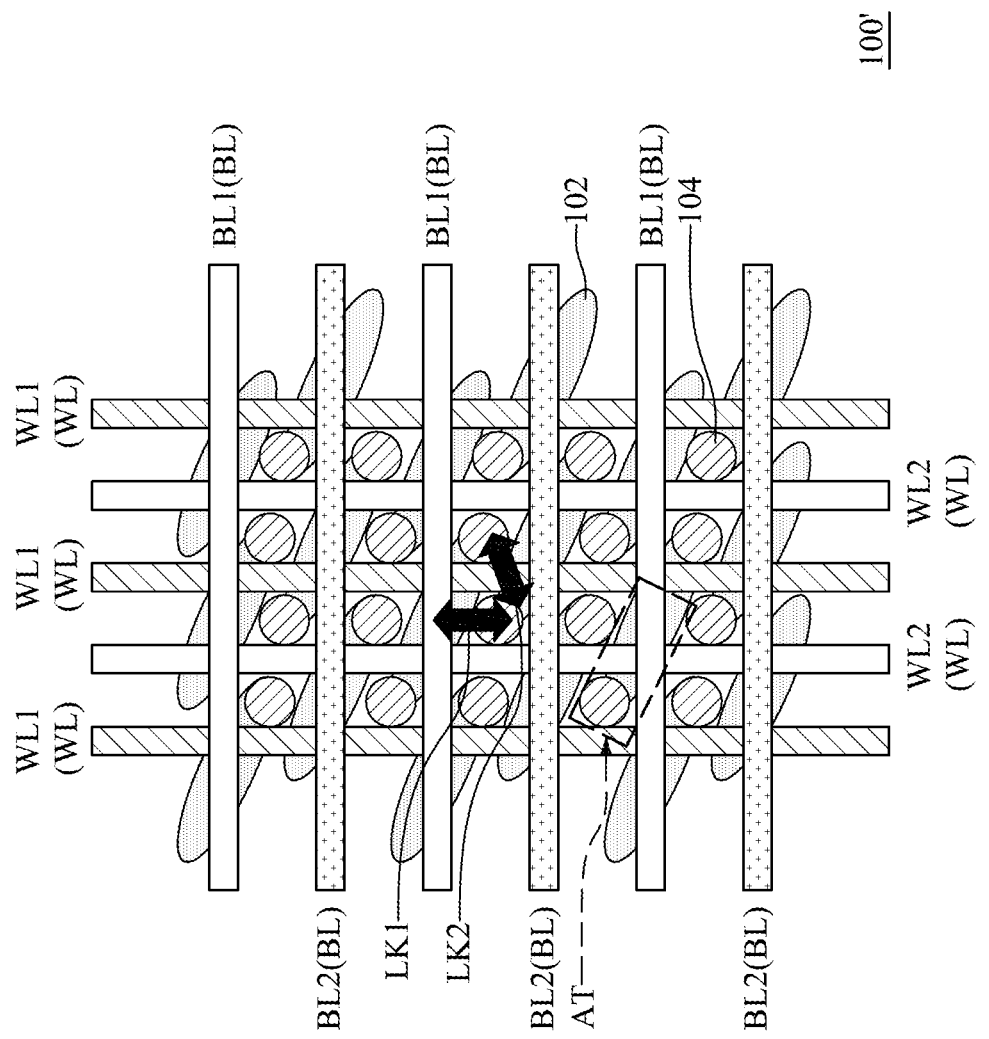
FIG. 3B is a schematic plan view illustrating a duplicate memory array under a test procedure, according to some embodiments of the present disclosure.

FIG. 3B is a schematic plan view illustrating the duplicate memory array 100' under a test procedure, according to some embodiments of the present disclosure.

Referring to FIG. 3B, the word lines WL may be grouped into first word lines WL1 and second word lines WL2. The first word lines WL1 and the second word lines WL2 are alternately arranged, and are configured to receive a turn-on voltage and a pass voltage, respectively. The first word lines WL1 may turn on the coupled transistors AT by receiving the turn-on voltage. On the other hand, the transistors AT coupled to the second word lines WL2 holding at the pass voltage may be remained off. In those embodiments where the transistors AT are N-type field effect transistors, the turn-on voltage may be a positive voltage, while the pass voltage may be a ground voltage. Further, in those embodiments where each active area 102 and the intersecting bit line BL is shared by a pair of the transistors AT, one of the transistors AT in each pair is turned on, while the other is kept in an off state. In these embodiments, one of the storage capacitors SC (not shown in FIG. 3B) coupled to the transistors AT sharing an active area 102 through a capacitor contact 104 could be controlled by the intersecting bit line BL, while the other should be inaccessible.

Similarly, the bit lines BL may be grouped into alternately arranged first bit lines BL1 and second bit lines BL2. The second bit lines BL2 are configured to receive a high voltage. The storage capacitors SC (not shown in FIG. 3B) coupled to the capacitor contacts 104 of the transistors AT being turned on by the first word lines WL1 and connected to the second bit lines BL2 are charged by this high voltage. On the other hand, the first bit lines BL1 are configured to receive a low voltage, such as a ground voltage. The storage capacitors SC coupled to the capacitor contacts 104 of the transistors AT being turned on by the first word lines WL1 and connected to the first bit lines BL1 should be discharged, while the storage capacitors SC coupled to the capacitor contacts 104 of the transistors AT in an off state and connected to the first bit lines BL1 or the second bit lines BL2 are electrically floating.

As described above, the first bit lines BL1 should be holding at a low voltage (e.g., a ground voltage), while the second bit lines BL2 receive a high voltage. If some of the first bit lines BL1 are pulled up that electrical current could flow through these first bit lines BL1, there should be leakage paths in the duplicate memory array 100', and also in the memory array 100 within the die regions 302. For instance, if the leakage path LK1 is generated, a storage capacitor SC coupled to the capacitor contact 104 of a transistor AT in an on state and connected to a second bit line BL2 may pull up a neighboring first bit line BL1 through the leakage path LK1. As a result, electrical current may be detected on this neighboring first bit line BL1. In addition, considering existence of the leakage path LK2, a storage capacitor SC coupled to the capacitor contact 104 of a transistor AT in an on state and connected to a second bit line BL2 may charge a neighboring storage capacitor SC coupled to the capacitor contact 104 of a transistor AT in an on state and connected to a first bit line BL1, and this neighboring storage capacitor SC may further charge this first bit line BL1. As a result, electrical current may be detected on this first bit line BL1. Therefore, by detecting electrical current on the first bit lines BL1, at least these two possible types of leakage paths can be detected.

Figure 4A:
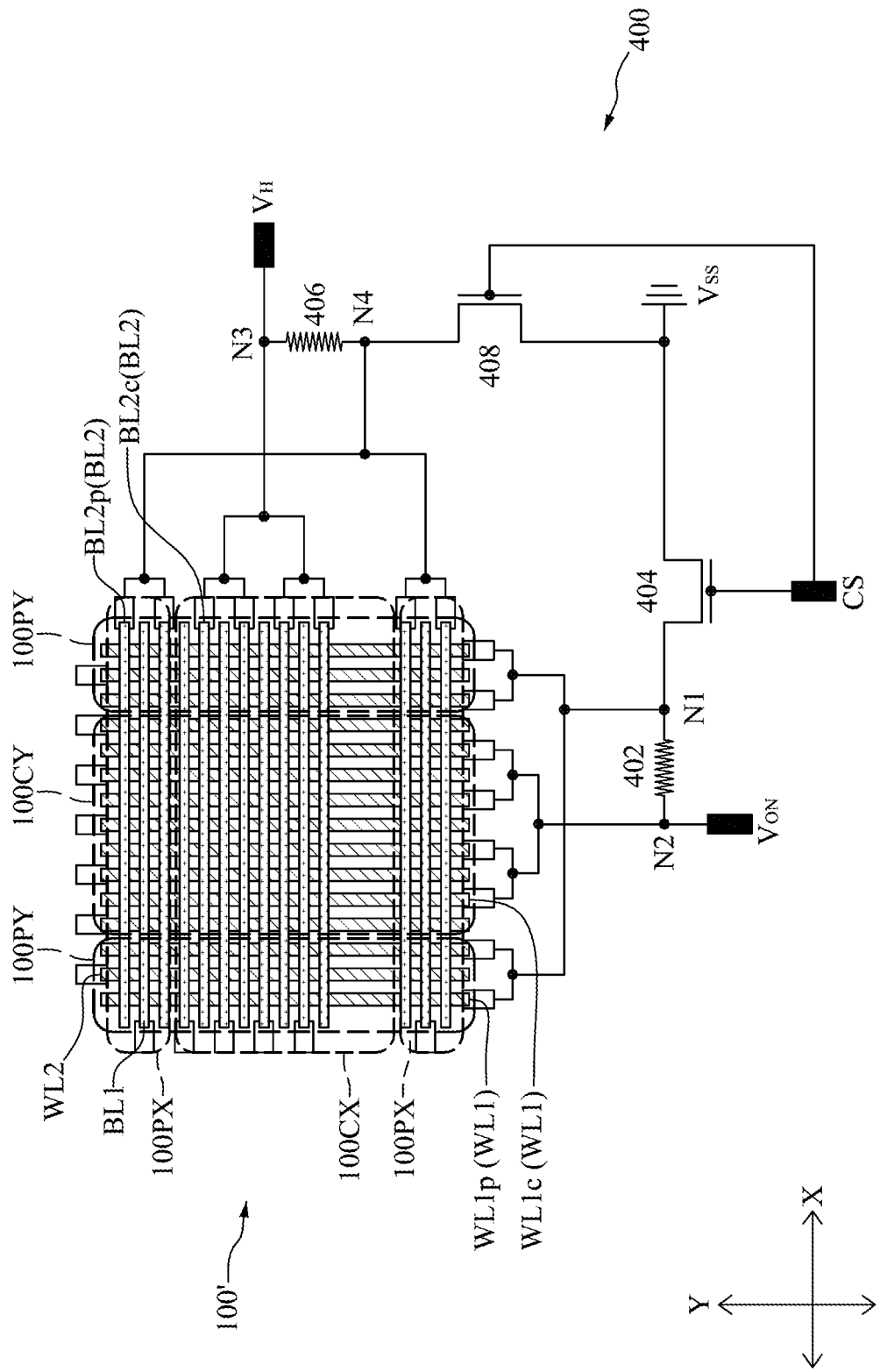
FIG. 4A is a schematic diagram illustrating a duplicate memory array and a test circuit in one of the test structures as shown in FIG. 3A, according to some embodiments of the present disclosure.

FIG. 4A is a schematic diagram illustrating the duplicate memory array 100' and a test circuit 400 in one of the test structures 306 as shown in FIG. 3A, according to some embodiments of the present disclosure.

Referring to FIG. 3B and FIG. 4A, in some embodiments, the first word lines WL1 and the second bit lines BL2 of the duplicate memory array 100' are coupled to the test circuit 400. The test circuit 400 is configured to selectively provide a turn-on voltage $V_{ON}$ to the first word lines WL1, and to selectively provide a logic high voltage $V_H$ to the second bit lines BL2. On the other hand, the second word lines WL2 may be coupled to a pass voltage. In addition, the first bit lines BL1 may be coupled to a low voltage, and subjected to electrical current sensing for detecting possible leakage paths as exemplarily described with reference to FIG. 3B. In some embodiments, the pass voltage and the low voltage are respectively a ground voltage.

The first word lines WL1 may be further grouped into peripheral first word lines WL1p and central first word lines WL1c. The peripheral first word lines WL1p are located within peripheral regions 100PY of the duplicate memory array 100', which extend along opposite sides of the duplicate memory array 100'. In addition, the peripheral first word lines WL1p are routed to a node N1 as a terminal of a fuse element 402 in the test circuit 400. On the other hand, the central first word lines WL1c are located within a central region 100CY of the duplicate memory array 100', which lies between the peripheral regions 100PY of the duplicate memory array 100'. In addition, the central first word lines WL1c are routed to a node N2 as the other terminal of the fuse element 402 and the turn-on voltage $V_{ON}$. As described with reference to FIG. 3B, the transistors AT with gate terminals coupled to the turn-on voltage $V_{ON}$ may be turned on, and the storage capacitors SC coupled thereto may become accessible.

The fuse element 402 is a one-time-programmable device that acts as a resistor while not being blown open. When the fuse element 402 acts as a resistor, the node N1 is coupled with the node N2 with few voltage drop. In other words, both of the node N2 and the node N1 are coupled to the turn-on voltage $V_{ON}$. Accordingly, the transistors AT coupled to the peripheral first word lines WL1p and the transistors AT coupled to the central first word lines WL1c are turned on, and both of the central region 100CY and the peripheral regions 100PY of the duplicate memory array 100' can be subjected to leakage test. On the other hand, when the fuse element 402 is blown open, the node N1 is decoupled from the node N2 and the turn-on voltage $V_{ON}$. In other words, when the fuse element 402 is blown open, the transistors AT coupled to the peripheral first word lines WL1p would not be turned on, while the transistors AT coupled to the central first word lines WL1c can still be turned on. As a result, only the central region 100CY of the duplicated memory array 100' can be subjected to leakage test.

In some embodiments, switching of the fuse element 402 is controlled by a transistor 404. For instance, the transistor 404 may be an N-type field effect transistors. A source/drain terminal of the transistor 404 is coupled to the first node N1, and the other source/drain terminal of the transistor 404 may be coupled to a reference voltage $V_{SS}$, such as a ground voltage. When the transistor 404 is in an off state, the node N1 as a terminal of the fuse element 402 is decoupled from the reference voltage $V_{SS}$, and a potential difference across the fuse element 402 is insufficient to rupture the fuse element 402. In this time, the fuse element 402 may act as a resistor. On the other hand, when the transistor 404 is turned on, the first node N1 as a terminal of the fuse element 402 is coupled to the reference voltage $V_{SS}$, while the node N2 as the other terminal of the fuse element 402 is coupled to the turn-on voltage $V_{ON}$. An electrical current passing through the fuse element 402 as a result of great potential difference between the nodes N1, N2 may blow off the fuse element 402. Therefore, the test circuit 400 is open at the fuse element 402. In some embodiments, a control signal CS is provided to a gate terminal of the transistor 404, for switching the transistor 404.

As similar to the first word lines WL1, the second bit lines BL2 may be further grouped into peripheral second bit lines BL2p and central second bit lines BL2c. The peripheral second bit lines BL2p are located within peripheral regions 100PX of the duplicate memory array 100', which extend along opposite sides of the duplicate memory array 100'. The peripheral regions 100PX are intersected with the peripheral regions 100PY in which the peripheral first word lines WL1p extend. In addition, the peripheral second bit lines BL2p are routed to a node N3 as a terminal of a fuse element 406 in the test circuit 400. On the other hand, the central second bit lines BL2c are located within a central region 100CX of the duplicated memory array 100', which lies between the peripheral regions 100PX of the duplicate memory array 100'. In addition, the central second bit lines BL2c are routed to a node N4 as the other terminal of the fuse element 406 and the logic high voltage $V_H$. As described with reference to FIG. 3B, the logic high voltage $V_H$ is provided for charging the coupled storage capacitors SC.

As similar to the fuse element 402, the fuse element 406 is a one-time-programmable device. The node N3 is coupled with the node N4 with few voltage drop when the fuse element 406 is not blown open. In other words, both of the node N3 and the node N4 are coupled to the logic high voltage $V_H$. Accordingly, the accessible storage capacitors SC coupled with the peripheral second bit lines BL2p and the accessible storage capacitors SC coupled to the central second bit lines BL2c can be charged. With such charge source, both of the peripheral regions 100PX and the central region 100CX can be subjected to leakage test. On the other hand, when the fuse element 406 is blown open, the node N4 is decoupled from the node N3. In other words, the storage capacitors SC coupled to the peripheral second bit lines BL2p would not be charged (even if they are accessible), while the accessible storage capacitors SC coupled to the central second bit lines BL2c can still be charged. As a result, only the central region 100CX of the duplicate memory array 100' can be subjected to leakage test.

In some embodiments, switching of the fuse element 406 is controlled by a transistor 408. For instance, the transistor 408 may be an N-type field effect transistors. A source/drain terminal of the transistor 408 is coupled to the first node N4, and the other source/drain terminal of the transistor 408 may be coupled to the reference voltage $V_{SS}$. When the transistor 408 is in an off state, the node N4 as a terminal of the fuse element 406 is decoupled from the reference voltage $V_{SS}$. As an insufficient potential difference across the fuse element 406, the fuse element 406 would not be blown open. Rather, the fuse element 406 may act as a resistor. On the other hand, when the transistor 408 is turned on, the node N4 as a terminal of the fuse element 406 is coupled to the reference voltage $V_{SS}$, while the node N3 as the other terminal of the fuse element 406 is coupled to the logic high voltage $V_H$. An electrical current passing through the fuse element 406 as a result of great potential difference between the nodes N3, N4 may blow off the fuse element 406. Therefore, the test circuit 400 is open at the fuse element 406. In some embodiments, the control signal CS is coupled to both of the gate terminal of the transistor 404 and a gate terminal of the transistor 408. In these embodiments, switching of the transistor 404 and switching of the transistor 408 can be simultaneously controlled.

As described above, portions of the duplicate memory array 100' in which the accessible storage capacitors SC are charged can be subjected to leakage test, as having charge source for possible leakages. On the other hand, portions of the duplicate memory array 100' in which the storage capacitors SC are inaccessible, and portions of the duplicate memory array 100' in which the accessible storage capacitors SC are not charged may not be subjected to leakage test. In other words, only the portions of the duplicated memory array 100', in which the first word lines WL1 are coupled to the turn-on voltage $V_{ON}$ and the second bit lines BL2 are coupled to the logic high voltage $V_H$, would be tested. Therefore, by switching the transistors 404, 408 for selectively providing the turn-on voltage $V_{ON}$ and the logic high voltage $V_H$ to the first word lines WL1 and the second bit lines BL2, localized leakage test can be performed.

During a step of the test procedure, the transistors 404, 408 are each in an off state. As a result, all of the first word lines WL1 are coupled to the turn-on voltage $V_{ON}$, and all of the second bit lines BL2 are coupled to the logic high voltage $V_H$. Therefore, the storage capacitors SC coupled to all of the first word lines WL1 and all of the second bit lines BL2 are accessible and charged. In other words, charge sources are provided throughout the duplicate memory array 100'. Accordingly, the entire duplicate memory array' 100 is subjected to leakage test.

Figure 4B:
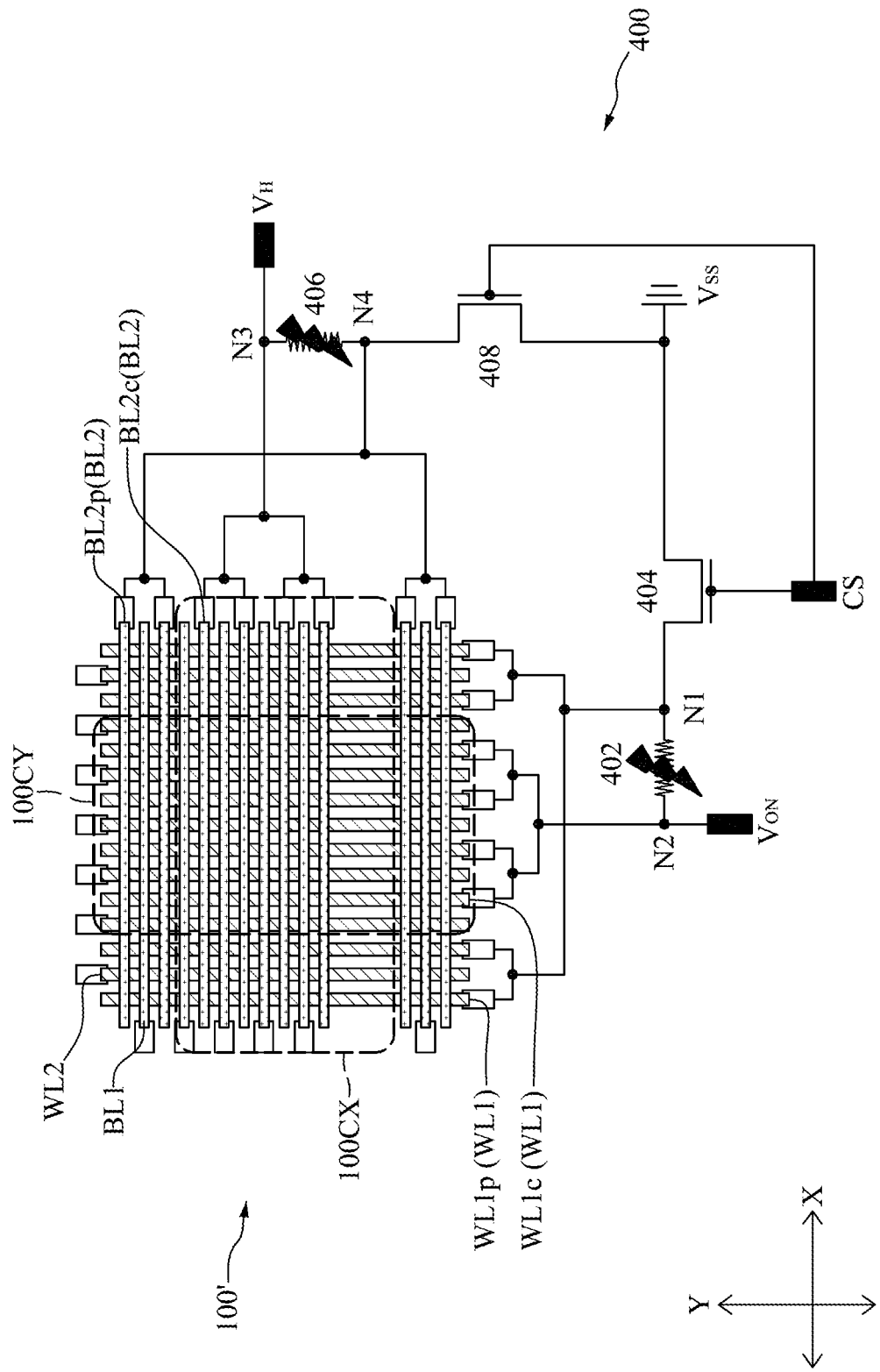
FIG. 4B is a schematic diagram illustrating the duplicate memory array and the test circuit as shown in FIG. 4A with both of the transistors being turned on, according to some embodiments of the present disclosure.

FIG. 4B is a schematic diagram illustrating the duplicate memory array 100' and the test circuit 400 with both of the transistors 404, 408 being turned on, according to some embodiments of the present disclosure.

Referring to FIG. 4B, during another step of the test procedure, both of the transistors 404, 408 are turned on by the control signal CS, and the fuse elements 402, 406 are both blown open. As a result, only the central first word lines WL1c are coupled to the turn-on voltage $V_{ON}$, and only the central second bit lines BL2c are coupled to the logic high voltage $V_H$. Therefore, only the storage capacitors SC coupled to the central first word lines WL1c and the central second bit lines BL2c are accessible and charged. In other words, charge sources are only provided in an intersection of the central region 100CX and the central region 100CY. Accordingly, the leakage test is narrowed down to the intersection of the central region 100CX and the central region 100CY of the duplicate memory array 100'.

By comparing a test result of the entire duplicate memory array 100' with a test result of a central portion of the duplicate memory array 100' (i.e., the intersection of the central regions 100CX, 100CY), whether a leakage path is prone to be generated in the central portion or a peripheral portion surrounding the central portion may be determined. In other words, localized information can be extracted from these test results.

Figure 5:
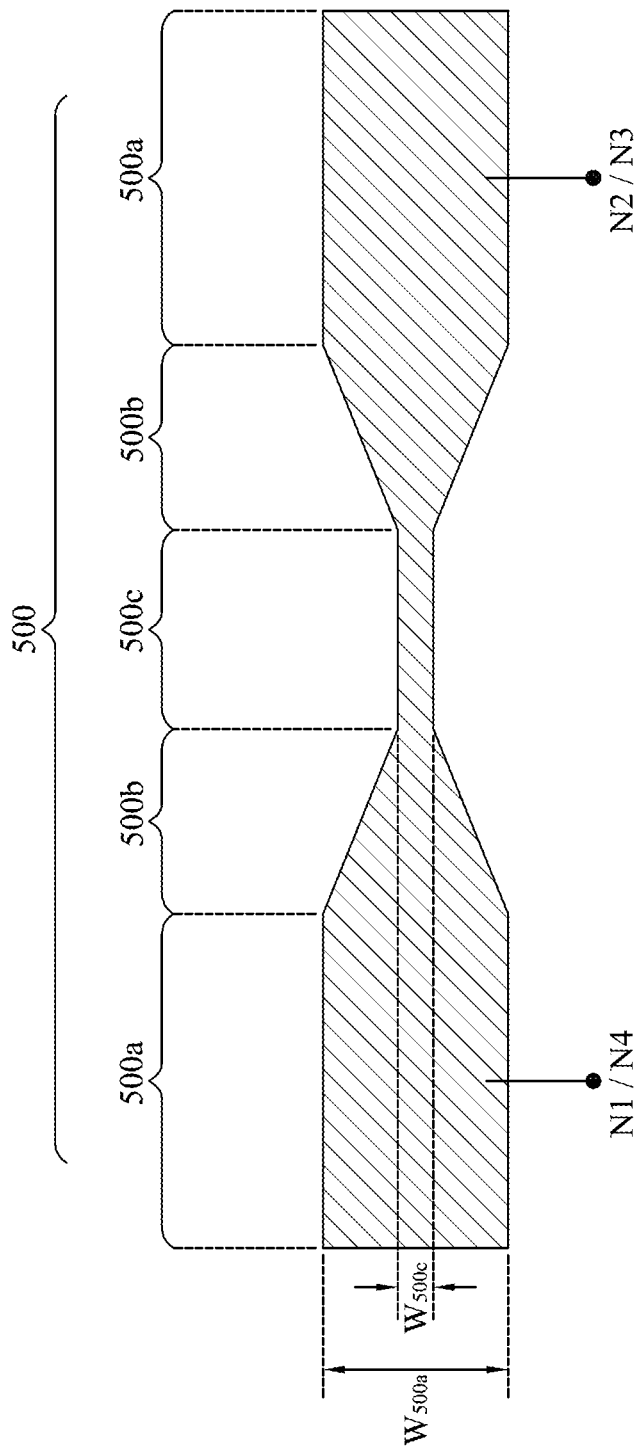
FIG. 5 is a schematic plan view illustrating the fuse element as shown in FIG. 4A and FIG. 4B, according to some embodiments of the present disclosure.

FIG. 5 is a schematic plan view illustrating the fuse element 402/406 described with reference to FIG. 4A and FIG. 4B, according to some embodiments of the present disclosure.

Referring to FIG. 5, the fuse element 402/406 may be formed by a conductive line segment 500. The conductive line segment 500 may have pad portions 500a, tapered portions 500b and a bridge portion 500c. The pad portions 500a are located at opposite sides of the conductive line segment 500. The tapered portions 500b extend from inner sides of the pad portions 500a, and are gradually tapered away from the inner sides of the pad portions 500a. The bridge portion 500c connects narrow ends of the tapered portions 500b. A width $W_{500c}$ of the bridge portion 500c may be substantially equal to a width of the narrow ends of the tapered portions 500b, and much less than a width $W_{500a}$ of the pad portions 500a, which may be substantially equal to a width of wide ends of the tapered portions 500b.

One of the pad portions 500a may be coupled to the node N2/N3, while the other pad portion 500a may be coupled to the node N1/N4. The node N2/N3 is coupled to the turn on voltage $V_{ON}$ or the logic high voltage $V_H$, as described with reference to FIG. 4A and FIG. 4B. When the node N1/N4 is coupled to the reference voltage $V_{SS}$, a large electrical current may pass through the conductive line segment 500 as a result of a great potential difference between the pad portions 500a. Since the bridge portion 500c is a necking portion along the conductive line segment 500, the bridge portion 500c may be ruptured as a result of current crowding effect and/or joule heating effect, thus the conductive line segment 500 (i.e., the fuse element 402/406) may be blown open. On the other hand, when the node N1/N4 is decoupled from the reference voltage $V_{SS}$, electrical current passing through the conductive line segment 500 (i.e., the fuse element 402/406) may not be great enough to rupture the bridge portion 500c of the conductive line segment 500, and the conductive line segment 500 may act as a resistor.

Figure 6A:
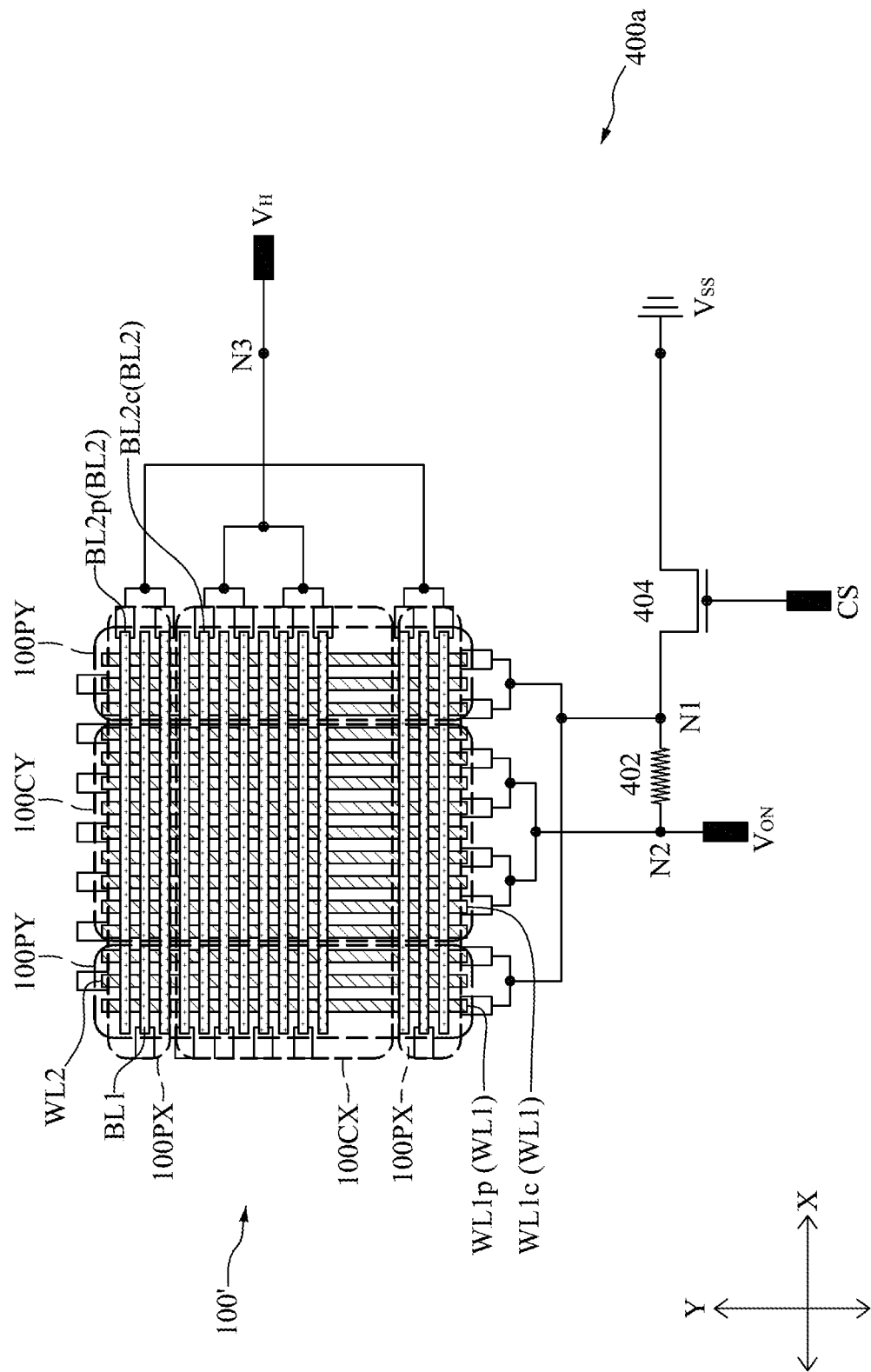
FIG. 6A is a schematic diagram illustrating a duplicate memory array and a test circuit coupled to the duplicate memory array, according to some embodiments of the present disclosure.

FIG. 6A is a schematic diagram illustrating the duplicate memory array 100' and a test circuit 400a coupled to the duplicate memory array 100', according to some embodiments of the present disclosure. The test circuit 400a is similar to the test circuit 400 as described with reference to FIG. 4A. Therefore, only differences between the test circuits 400, 400a will be described. The like or the same parts of the test circuits 400, 400a would not be repeated again.

Referring to FIG. 6A, the fuse element 406 as well as the transistor 408 as described with reference to FIG. 4A may be absent in the test circuit 400a. As a result, all of the second bit lines BL2 are routed to the node N3 that is coupled to the logic high voltage $V_H$, and the logic high voltage $V_H$ can be indiscriminately provided to all of the second bit lines BL2. Accordingly, the accessible storage capacitors SC in the peripheral regions 100PX and the accessible storage capacitors SC in the central region 100CX can both be charged.

On the other hand, the turn on voltage $V_{ON}$ can still be selectively provided to the first word lines WL1 by controlling the transistor 404. When the transistor 404 is in an off state, all of the first word lines WL1 are coupled to the turn on voltage $V_{ON}$. Accordingly, the transistors AT coupled to all of the first word lines WL1 are turned on, and the storage capacitors SC coupled to these transistors AT are accessible. Since the logic high voltage $V_H$ is indiscriminately provided to the second bit lines BL2, all of these accessible storage capacitors SC can be charged. In other words, charge sources are provided throughout the duplicate memory array 100'. Accordingly, the entire duplicate memory array' 100 is subjected to leakage test.

During another step of the test procedure, the transistor 404 is turned on, and the central first word lines WL1c are coupled to the turn-on voltage $V_{ON}$, while the peripheral first word lines WL1p are decoupled from the turn on voltage $V_{ON}$ due to rupture of the fuse element 402. Therefore, only the storage capacitors SC coupled to the central first word lines WL1c are accessible. Since the logic high voltage $V_H$ is indiscriminately provided to the second bit lines BL2, all of these accessible storage capacitors SC can be charged. In other words, charge sources are provided in the central region 100CY, but not in the peripheral regions 100PY. Accordingly, the leakage test is narrowed down to the central region 100CY of the duplicate memory array 100'.

By comparing a test result of the entire duplicate memory array 100' with a test result of the central region 100CY of the duplicate memory array 100', whether a leakage path is prone to be generated in the central region 100CY or the peripheral regions 100PY may be determined.

Figure 6B:
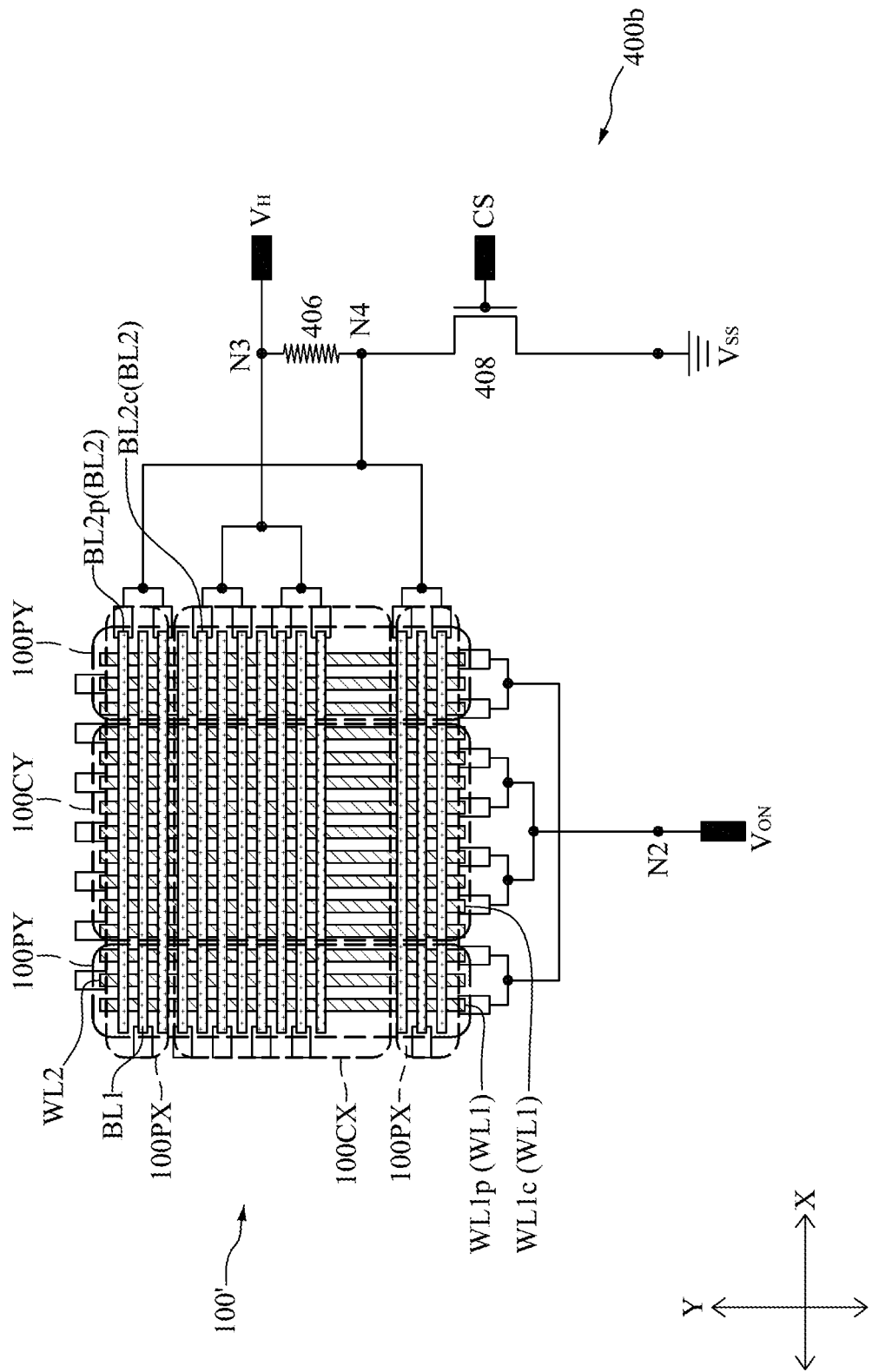
FIG. 6B is a schematic diagram illustrating a duplicate memory array and a test circuit coupled to the duplicate memory array, according to some embodiments of the present disclosure.

FIG. 6B is a schematic diagram illustrating the duplicate memory array 100' and a test circuit 400b coupled to the duplicate memory array 100', according to some embodiments of the present disclosure. The test circuit 400b is similar to the test circuit 400 as described with reference to FIG. 4A. Therefore, only differences between the test circuits 400, 400b will be described. The like or the same parts of the test circuits 400, 400b would not be repeated again.

Referring to FIG. 6B, the fuse element 402 as well as the transistor 404 as described with reference to FIG. 4A may be absent in the test circuit 400b. As a result, all of the first word lines WL1 are routed to the node N2 that is coupled to the turn on voltage $V_{ON}$, and the turn on voltage $V_{ON}$ can be indiscriminately provided to all of the first word lines WL1. Accordingly, the storage capacitors SC in the peripheral regions 100PY and the storage capacitors SC in the central region 100CY can both be accessible.

On the other hand, the logic high voltage $V_H$ can still be selectively provided to the second bit lines BL2 by controlling the transistor 406. When the transistor 406 is in an off state, all of the second bit lines BL2 are coupled to the logic high voltage $V_H$. Accordingly, all of the accessible storage capacitors SC in the peripheral regions 100PY and the central region 100CY can be charged. In other words, charge sources are provided throughout the duplicate memory array 100'. Accordingly, the entire duplicate memory array' 100 is subjected to leakage test.

During another step of the test procedure, the transistor 406 is turned on, and the central second bit lines BL2c are coupled to the logic high voltage $V_H$, while the peripheral second bit lines BL2p are decoupled from the logic high voltage $V_H$ due to rupture of the fuse element 406. Therefore, only the accessible storage capacitors SC coupled to the central second bit lines BL2c can be charged. In other words, charge sources are provided in the central region 100CX, but not in the peripheral regions 100PX. Accordingly, the leakage test is narrowed down to the central region 100CX of the duplicate memory array 100'.

By comparing a test result of the entire duplicate memory array 100' with a test result of the central region 100CX of the duplicate memory array 100', whether a leakage path is prone to be generated in the central region 100CX or the peripheral regions 100PX may be determined.

Figure 7:
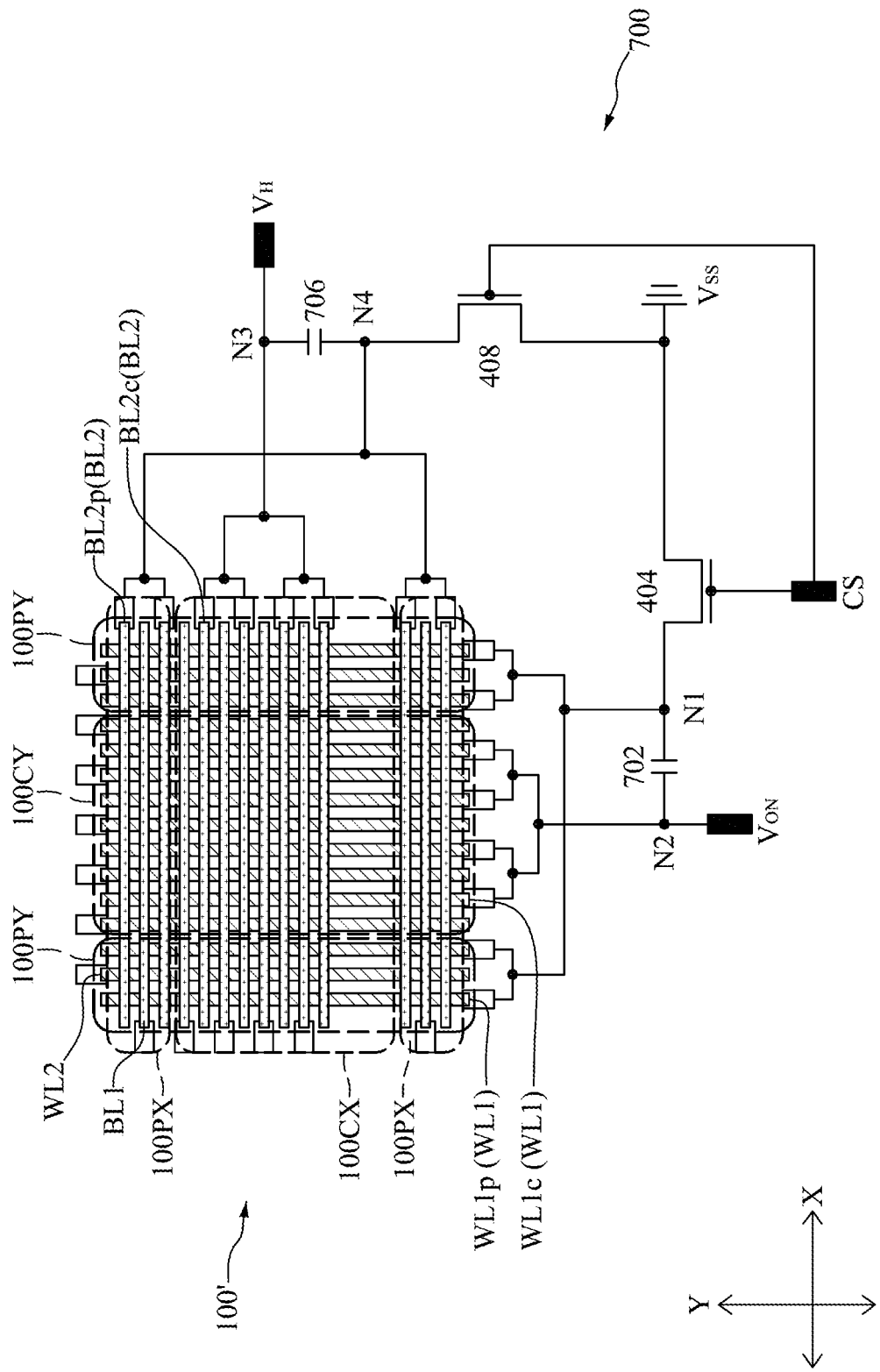
FIG. 7 is a schematic diagram illustrating a duplicate memory array and a test circuit coupled to the duplicate memory array, according to some embodiments of the present disclosure.

FIG. 7 is a schematic diagram illustrating the duplicate memory array 100' and a test circuit 700 coupled to the duplicate memory array 100', according to some embodiments of the present disclosure. The test circuit 700 is similar to the test circuit 400 as described with reference to FIG. 4A. Therefore, only differences between the test circuits 400, 700 will be described. The like or the same parts of the test circuits 400, 700 would not be repeated again.

Referring to FIG. 7, the node N2 is connected to the node N1 through an anti-fuse element 702, which is also a one-time-programmable device. For instance, the anti-fuse element 702 is a capacitor that acts as an open circuit when a potential difference across the anti-fuse element 702 is not great enough for dielectric breakdown. On the other hand, when a sufficient potential difference is applied across the anti-fuse element 702, the anti-fuse element 702 may become a short circuit as a result of dielectric breakdown.

When the transistor 404 is in an off state, the node N1 is decoupled from the reference voltage $V_{SS}$. A potential difference across the anti-fuse element 702 may not be great enough to cause dielectric breakdown, thus the anti-fuse element 702 may act as an open circuit. Accordingly, the turn on voltage $V_{ON}$ is provided to the central first word lines WL1c, but not provided to the peripheral first word lines WL1p. As a result, only the transistors AT coupled to the central first word lines WL1c are turned on, and only the storage capacitors SC coupled to these transistors AT are accessible. On the other hand, when the transistor 404 is turned on, the node N1 is coupled to the reference voltage $V_{SS}$. As a result, a great potential difference across the anti-fuse element 702 may cause dielectric breakdown, and the anti-fuse element 702 may become a short circuit. Accordingly, the node N1 and the node N2 can be both coupled to the turn on voltage $V_{ON}$, and the transistors AT coupled to the central first word lines WL1c and the peripheral first word lines WL1p are turned on. Therefore, the storage capacitors SC coupled to these transistors AT are accessible.

Similarly, the node N3 is connected to the node N4 through an anti-fuse element 706. When the transistor 408 is in an off state, the node N4 is decoupled from the reference voltage $V_{SS}$, and the anti-fuse element 706 may act as an open circuit. Accordingly, the logic high voltage $V_H$ is provided to the central second bit lines BL2c, but not provided to the peripheral second bit lines BL2p. As a result, only the accessible storage capacitors SC coupled to the central second bit lines BL2c are charged. On the other hand, when the transistor 408 is turned on, the node N3 is coupled to the reference voltage $V_{SS}$, and the anti-fuse element 706 may become a short circuit. Accordingly, the node N3 and the node N4 can be both coupled to the logic high voltage $V_H$, and the accessible storage capacitors SC coupled to the central second bit lines BL2c and the peripheral second bit lines BL2p are charged.

Therefore, by turning on the transistors 404, 408, charge sources can be provided throughout the duplicate memory array 100', and the entire duplicate memory array 100' can be subjected to leakage test. Accordingly, a global leakage test result can be obtained. On the other hand, by keeping the transistors 408, 408 in an off state, charge sources can only be provided at an intersection of the central regions 100PY, 100PX, and the leakage test is narrowed down to such small area. As a result, a localized leakage test result can be obtained. By comparing the localized leakage test result with the global leakage test result, localized leakage information can be extracted.

As similar to the variation described with reference to FIG. 6A, the anti-fuse element 706 and the transistor 408 may be omitted from the test circuit 700, and the logic high voltage $V_H$ can be indiscriminately provided to all of the second bit lines BL2. In addition, as similar to the variation described with reference to FIG. 6B, the anti-fuse element 702 and the transistor 404 may be omitted from the test circuit 700, and the turn on voltage $V_{ON}$ can be indiscriminately provided to all of the first word lines WL1.

As above, the present disclosure provides a method for evaluating leakage condition in a memory array within a die region by testing a duplicate memory array formed in a scribe line region. Therefore, such evaluation method is non-destructive to the memory array within the die region. Further, a test circuit coupled to the duplicate memory array is configured to selectively provide charge sources to the entire duplicate memory array or a portion of the duplicate memory array, in order to obtain a global leakage test result and a localized leakage test result. By comparing the global leakage test result and the localized leakage test result, localized leakage information can be extracted.

In an aspect of the present disclosure, a memory test circuit is provided. The memory circuit is coupled to a memory array having intersecting first and second signal lines, and comprises: a first fuse element with a first terminal coupled to a first group of the first signal lines and a second terminal coupled to second and third groups of the first signal lines, wherein the first terminal is coupled to a first test voltage; and a first transistor, with a first source/drain terminal coupled to the second terminal of the first fuse element and a second source/drain terminal coupled to a reference voltage, wherein the first fuse element is configured to be blown open when the first transistor is turned on for coupling the second terminal of the first fuse element to the reference voltage, and the first fuse element acts as a resistor when the first transistor is kept off for decoupling the second terminal of the first fuse element from the reference voltage.

In another aspect of the present disclosure, a memory test circuit is provided. The memory circuit is coupled to a memory array having intersecting first and second signal lines, and comprises: a first anti-fuse element with a first terminal coupled to a first group of the first signal lines and a second terminal coupled to second and third groups of the first signal lines, wherein the first terminal is coupled to a first test voltage; and a first transistor, with a first source/drain terminal coupled to the second terminal of the first anti-fuse element and a second source/drain terminal coupled to a reference voltage, wherein the first anti-fuse element acts as a short circuit when the first transistor is turned on for coupling the second terminal of the first anti-fuse element to the reference voltage, and the first fuse element acts as an open circuit when the first transistor is kept off for decoupling the second terminal of the first anti-first fuse element from the reference voltage.

In yet another aspect of the present disclosure, a device wafer is provided. The device wafer has die regions and a scribe line region extending between the die regions, and comprises: memory arrays, disposed in the die regions; a duplicate memory array, disposed in the scribe line region, and substantially identical with one of the memory arrays in the die regions; and a test circuit, disposed in the scribe line region and coupled to the duplicate memory array. The test circuit comprises: a first one-time programmable device with a first terminal coupled to a first group of first signal lines of the duplicate memory array and a second terminal coupled to second and third groups of the first signal lines, wherein the first terminal is coupled to a first test voltage; and a first transistor, with a first source/drain terminal coupled to the second terminal of the first one-time programmable device and a second source/drain terminal coupled to a reference voltage.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A memory test circuit, coupled to a memory array having intersecting first and second signal lines, and comprising:
   a first fuse element with a first terminal coupled to a first group of the first signal lines and a second terminal coupled to second and third groups of the first signal lines, wherein the first terminal is coupled to a first test voltage; and
   a first transistor, with a first source/drain terminal coupled to the second terminal of the first fuse element and a second source/drain terminal coupled to a reference voltage, wherein the first fuse element is configured to be blown open when the first transistor is turned on for coupling the second terminal of the first fuse element to the reference voltage, and the first fuse element acts as a resistor when the first transistor is kept off for decoupling the second terminal of the first fuse element from the reference voltage.

2. The memory test circuit according to claim 1, wherein the second and third groups of the first signal lines are coupled to the reference voltage when the first fuse element is blown open, and coupled to the first test voltage through the first fuse element when the first fuse element acts as a resistor.

3. The memory test circuit according to claim 1, wherein the first group of the first signal lines extend between the second and third groups of the first signal lines.

4. The memory test circuit according to claim 1, further comprising:
   a second fuse element with a first terminal coupled to a first group of the second signal lines and a second terminal coupled to second and third groups of the second signal lines, wherein the first terminal is coupled to a second test voltage; and
   a second transistor, with a first source/drain terminal coupled to the second terminal of the second fuse element and a second source/drain terminal coupled to the reference voltage, wherein the first second element is configured to be blown open when the second transistor is turned on for coupling the second terminal of the second fuse element to the reference voltage, and the second fuse element acts as a resistor when the second transistor is kept off for decoupling the second terminal of the second fuse element from the reference voltage.

5. The memory test circuit according to claim 4, wherein the second and third groups of the second signal lines are coupled to the reference voltage when the second fuse element is blown open, and coupled to the second test voltage through the second fuse element when the second fuse element acts as a resistor.

6. The memory test circuit according to claim 4, wherein the first group of the second signal lines extend between the second and third groups of the second signal lines.

7. The memory test circuit according to claim 4, wherein gate terminals of the first and second transistors are coupled to a control signal.

8. The memory test circuit according to claim 1, wherein all of the second signal lines are coupled to a second test voltage.

9. The memory test circuit according to claim 1, wherein the memory array further comprises third signal lines and fourth signal lines, the first and third signal lines are alternately arranged along a first direction, and the second and fourth signal lines are alternately arranged along a second direction.

10. The memory test circuit according to claim 9, wherein the third signal lines are not coupled to the first test voltage, the second signal lines are selectively or indiscriminately coupled to a second test voltage, and the fourth signal lines are not coupled to the second test voltage.

11. The memory test circuit according to claim 9, wherein the memory array is a dynamic random access memory (DRAM) array.

12. The memory test circuit according to claim 11, wherein the first and third signal lines are word lines, and the second and fourth signal lines are bit lines.

13. The memory test circuit according to claim 11, wherein the first and third signal lines are bit lines, and the second and fourth signal lines are word lines.

14. A memory test circuit, coupled to a memory array having intersecting first and second signal lines, and comprising:
   a first anti-fuse element with a first terminal coupled to a first group of the first signal lines and a second terminal coupled to second and third groups of the first signal lines, wherein the first terminal is coupled to a first test voltage; and
   a first transistor, with a first source/drain terminal coupled to the second terminal of the first anti-fuse element and a second source/drain terminal coupled to a reference voltage, wherein the first anti-fuse element acts as a short circuit when the first transistor is turned on for coupling the second terminal of the first anti-fuse element to the reference voltage, and the first fuse element acts as an open circuit when the first transistor is kept off for decoupling the second terminal of the first anti-first fuse element from the reference voltage.

15. The memory test circuit according to claim 14, wherein the second and third groups of the first signal lines are coupled to the first test voltage when the first fuse element acts as a short circuit, and coupled to the reference voltage when the first fuse element acts as an open circuit.

16. The memory test circuit according to claim 14, further comprising:
   a second anti-fuse element with a first terminal coupled to a first group of the second signal lines and a second terminal coupled to second and third groups of the second signal lines, wherein the first terminal is coupled to a second test voltage; and
   a second transistor, with a first source/drain terminal coupled to the second terminal of the second anti-fuse element and a second source/drain terminal coupled to the reference voltage, wherein the second anti-fuse element acts as a short circuit when the second transistor is turned on for coupling the second terminal of the second anti-fuse element to the reference voltage, and the second anti-fuse element acts as an open circuit when the second transistor is kept off for decoupling the second terminal of the second anti-first fuse element from the reference voltage.

17. The memory test circuit according to claim 16, wherein gate terminals of the first and second transistors are coupled to a control signal.

18. The memory test circuit according to claim 14, wherein all of the second signal lines are coupled to a second test voltage.

19. A device wafer, having die regions and a scribe line region extending between the die regions, and comprising:
   memory arrays, disposed in the die regions;
   a duplicate memory array, disposed in the scribe line region, and substantially identical with one of the memory arrays in the die regions; and
   a test circuit, disposed in the scribe line region and coupled to the duplicate memory array, and comprising:
      a first one-time programmable device with a first terminal coupled to a first group of first signal lines of the duplicate memory array and a second terminal coupled to second and third groups of the first signal lines, wherein the first terminal is coupled to a first test voltage; and
      a first transistor, with a first source/drain terminal coupled to the second terminal of the first one-time programmable device and a second source/drain terminal coupled to a reference voltage.

20. The device wafer according to claim 19, wherein the test circuit further comprises:
   a second one-time programmable device with a first terminal coupled to a first group of second signal lines of the duplicate memory array and a second terminal coupled to second and third groups of the second signal lines, wherein the first terminal is coupled to a second test voltage; and
   a second transistor, with a first source/drain terminal coupled to the second terminal of the second one-time programmable device and a second source/drain terminal coupled to the reference voltage.

* * * * *